United States Patent [19]

Ohmi

[11] Patent Number: 5,352,917
[45] Date of Patent: Oct. 4, 1994

[54] ELECTRONIC DEVICE PROVIDED WITH METAL FLUORIDE FILM

[76] Inventor: Tadahiro Ohmi, 1-17-301, Komegakubo 2-chome, Aoba-ku, Sendai-shi, Miyagi-ken 980, Japan

[21] Appl. No.: 966,052
[22] PCT Filed: Jul. 4, 1991
[86] PCT No.: PCT/JP91/00902
§ 371 Date: Jan. 4, 1993
§ 102(e) Date: Jan. 4, 1993
[87] PCT Pub. No.: WO92/01310
PCT Pub. Date: Jan. 23, 1992

[30] Foreign Application Priority Data

Jul. 4, 1990 [JP] Japan .................. 2-177039

[51] Int. Cl.$^5$ ............ H01B 12/00; H01L 39/12; H01L 39/22; C04B 35/02
[52] U.S. Cl. .................. 257/410; 257/410; 257/30; 257/31; 257/36
[58] Field of Search .......... 423/465; 266/286; 501/123, 9; 257/30, 31, 36, 410

[56] References Cited

U.S. PATENT DOCUMENTS

| | | | |
|---|---|---|---|
| 4,998,710 | 3/1991 | Pelton | 266/286 |
| 5,155,094 | 10/1992 | Okabe et al. | 505/1 |

FOREIGN PATENT DOCUMENTS

| | | |
|---|---|---|
| 0237500 | 10/1985 | Japan . |
| 0239444 | 10/1985 | Japan . |
| 0420277 | 10/1985 | Japan . |
| 0288755 | 12/1985 | Japan . |
| 0288759 | 12/1985 | Japan . |
| 0288719 | 12/1987 | Japan . |
| 3268518 | 10/1988 | Japan . |

*Primary Examiner*—William L. Sikes
*Assistant Examiner*—Fetsum Abraham
*Attorney, Agent, or Firm*—Baker & Daniels

[57] ABSTRACT

An electronic device provided with a metal fluoride film which can be formed at a low temperature with a high processing accuracy, characterized in that the metal fluoride film is used in at least part of an insulting film.

10 Claims, 6 Drawing Sheets

ELECTRONIC DEVICE PROVIDED WITH METAL FLUORIDE FILM

BACKGROUND OF THE INVENTION

1. Field of the Invention

The present invention relates to an electronic device provided with a metal fluoride film.

2. Description of Related Art

The conventional technology will be explained using the example of a semiconductor device as the electronic device.

Conventionally, among semiconductor devices, devices are known which utilize a silicon oxide film formed by the CVD method as an insulating film. In the case in which the insulating film is for the purpose of insulating and separating between electrodes, this insulating film is formed by the accumulation on a substrate of a silicon oxide layer, by means of bringing gas-containing silicon atoms and gas-containing oxygen molecules into contact with the surface of the silicon, metal, metal silicide, or silicon oxide film on a silicon substrate at high temperatures (for example, at temperatures of more than 400° C.).

However, this insulating film has problems in that the temperature at which formation occurs must be high, and a low-temperature process has not been realized.

Hereinbelow, the need for a low temperature process will be explained, taking as an example the formation of a MOSLSI insulating film.

The pace of development in the field of LSI technology has been extremely high, and DRAMs of more than 1 Mbit have already been realized. In the production of such high performance electronic devices, that is to say, devices which are very fine and have a very high degree of integration, it is clear that a high performance production process which has few undesirable effects on indeterminate elements and is more subject to control is necessary. Low temperature processes have been suggested for use as this high performance process.

For example, a lowering of the process temperature is effective in reducing warping of the silicon substrate, deformation in the material of the silicon device construction, and defect density.

Furthermore, if the formation temperature of the insulating film is lower than approximately 400° C., it becomes possible to form the insulating film after the formation of a metal or alloy having a low melting point (for example, an aluminum alloy), so that semiconductor devices having various functions can be realized. In particular, if the temperature is below 400° C., for example, in the case of a thin aluminum film, as a hillock is not formed, this is particularly effective. As stated above, a lowering of the temperature at which the insulating film is formed is necessary for the realization of ultra LSI.

However, in the prior art, as only high temperature processes existed, ultra LSI and high performance semiconductor devices could not be realized.

Furthermore, in the prior art, for example, in the case in which an interlayer insulating film (a silicon oxide film) was formed in an MOS, a silicon oxide film was formed over the entire surface by means of the CVD method. However, in the case of this insulating film, at the time of the formation of contact holes, the use of masking to form contact holes at specified positions could not be avoided, and accordingly, processing by means of so-called "self-alignment" could not be attained, and only devices having poor processing accuracy could be realized.

It is an object of the present invention to provide an electronic device provided with metal fluoride film which can be produced by means of a low temperature process and which furthermore has a high processing accuracy.

SUMMARY OF THE INVENTION

The present invention is primarily directed to an electronic device which is characterized in that metal fluoride film is used in at least part of an insulating film.

Execution Example

Here, examples of electronic devices include, for example, semiconductor devices, devices having Josephson junctions, and devices having insulating films formed for various purposes.

Furthermore, examples of semiconductor devices include, for example, MOS (field effect transistors) and other types of devices. In this case, examples of insulating films include, for example, interlayer insulating films, and insulating films which insulate and separate between a gate electrode and a source, and/or between drain electrodes.

Furthermore, in the case of devices having Josephson junctions, an example thereof is an insulating film in a junction portion between superconductors.

Examples of metals in the metal fluoride film include, for example, Al, Ni, Cr, Ti, Ta, W, Mo, Nb, and the like. Furthermore, alloys which have these various metals as main components thereof are acceptable. Because a low temperature process is possible, the present invention will exhibit particularly striking effects in the case in which, among these metals and alloys, a metal with a low melting point is used.

In the case of an AlMg alloy, it is preferable that the amount of Mg contained be within a range of from 0.02-15 wt %, and more preferably, within a range of 0.02-5 wt %. An alloy falling within these ranges has particularly strong resistance to corrosive gasses and corrosive liquids, and is particularly preferable in the case in which an insulating film is used in a later process for masking.

Next, the formation method of the metal fluoride film will be explained.

This insulating film may be formed by means of a sputtering method using a target comprising, for example, metal fluoride; however, other methods (direct fluoridation) are preferable. Hereinbelow, these methods will be explained.

Formation of the Alloy Layer

First, the metal comprising the metal fluoride film is formed at the desired positions. The formation method thereof is not particularly restricted. For example, in the case of Ni, formation may be conducted by means of a nonelectrolytic plating method, and a suitable method may be selected in correspondence with the characteristics of the various metals and the fabrication circumstances of the electronic device. In the case of Ni, at the time of formation by means of a plating method, by means of including P (phosphorus) in the plating bath, excellent plating can be obtained; however, when a Ni-P layer formed in this manner is fluoridated, after fluoridation, the P is dissipated from the insulating film. The reason for the dissipation of the P is unclear; however, because the P dissipates, the resistance to corrosion of this insulating film is not reduced, and it may also be used for masking. The amount of phosphorus contained in the Ni film containing phosphorus is not particularly limited; however, it is preferable that it be in the range of 1-20 wt %, and more preferably in the range of 6-12 wt %.

The formation of a Ni film containing phosphorus by means of a nonelectrolytic plating method forms, for example, a nickel film selectively containing phosphorus on a metal film such as an Al film or the like, so that, as shown in FIG. 2(c), this may be accomplished after specified regions have been etched by means of reactive ion etching.

Fluoridation Processing

Next, the fluoridation procedure will be explained. This procedure consists largely of 2 processes.

That is to say, this procedure consists of a first process, in which a gas-containing fluorine or molecule-containing fluorine is brought into contact with the surface of a metal layer on which a fluoride film is to be formed, and a fluoride film is thus formed on the surface of the metal layer; and a second process, in which the fluoride layer is thermally processed at a temperature of, for example, 20°-500° C. in an atmosphere of an inert gas, and thereby the bond of fluorine and at least 1 type of atom which comprises a basic surface in the fluoride film is strengthened.

By means of conducting such fluoridation processing, a fluoride film is formed only on the surface of the metal layer. Accordingly, in the case in which the metal layer is used, for example, as an MOS electrode, as the fluoride film extends in a lateral direction as well, the gate length can be shortened. Furthermore, as shown in FIGS. 2(c) and 2(d), it is possible to conduct the formation of contact holes by means of self-alignment, so that an MOS with an extremely high degree of processing accuracy can be obtained.

Furthermore, this fluoride film has a high resistance to corrosion, so that it can be used for masking in later processes.

First Process

In the first process using the above method, examples of the gas including fluorine and/or molecules including fluorine include, for example, fluorine gas, hydrogen fluoride gas, nitrogen fluoride gas, and mixtures of these gasses, as well as a mixture of such gasses with inert gasses, and the like.

Examples of the inert gas used in the first process in the above method include, for example, nitrogen gas, argon gas, helium gas, and the like.

From the point of view of an improvement in the characteristics (for example, insulating ability and resistance to corrosion) of the insulating film by means of the fluoridation reaction, it is preferable that the concentration of impurities in the gas phase (moisture, hydrocarbons, or the like) be less than a level of tens of ppb or less, a level of ones ppb or less being more preferable, and a level of 0.1 ppb or less being most preferable.

With regard to the substrate body temperature in the first process, a range of 20°-500° C. is preferable, and a range of 100°-400° C. is more preferable; however, temperatures near 400° C. are most preferable, in that the object of the invention can be achieved in a short time period, thus improving the utility of the invention.

The pressure of the gas phase is not particularly limited; low pressure ranges, normal pressure ranges, or high pressure ranges may be employed.

Concrete examples of the formation of a fluoride layer by means of such a procedure follow.

(1) In the case in which an aluminum alloy containing 3.5 wt % of magnesium was heated at a temperature of 300° C. for 80 minutes in a mixed gas atmosphere containing fluorine gas and nitrogen gas, a mixed layer of aluminum fluoride and magnesium fluoride having a thickness of 10 nm was formed on the aluminum alloy surface.

There was no change in the thickness of the fluoride film before and after conducting thermal processing (annealing) for 2 hours at a temperature of 350° C. in an atmosphere of nitrogen gas; however, the bonding energy of the fluoride layer was increased by means of the thermal processing. Accordingly, in this method, for example, by heating an aluminum alloy film containing magnesium which is formed on a silicon substrate in an atmosphere of fluorine gas, and then heating it in an atmosphere of nitrogen gas, it became clear that it is possible to form, at low temperatures, a fluoride film having a thickness of more than 3 nm and in which the bonds between aluminium and fluorine, and magnesium and fluorine, are strong.

(2) In the case in which a Ni film containing 6 wt % of phosphorus, which was formed by means of nonelectrolytic plating in an atmosphere of a mixed gas containing fluorine gas and nitrogen gas, was heated at a temperature of 300° C. for a period of 100 minutes, a nickel fluoride film with a thickness of 55 nm was formed on the surface of the nickel alloy film.

There was no change in the thickness of the fluoride film before and after thermal processing (annealing) was conducted for 2 hours at a temperature of 350° C. in a atmosphere of nitrogen gas; however, the bonding energy of the fluoride film was increased by the heat processing. Accordingly, in the present method, for example, by heating, in an atmosphere of fluorine gas, a nickel alloy film containing phosphorus which is formed on a silicon substrate, and then heating this in an atmosphere of nitrogen gas, it became clear that it is possible to form, at low temperatures, a fluoride film having a thickness of more than 3 nm and in which the bonds between fluorine and nickel are strong.

Preprocessing: Baking, Cleaning

In the first process, a gas-containing fluorine and/or molecule-containing fluorine was brought into contact with the surface of a substrate body on which a fluoride film was to be formed, and thereby, a fluoride film was formed on the surface of the substrate body; however, when thermal processing (baking) of the substrate body is conducted prior to the first process in an atmosphere of an inert gas or in a vacuum or a low pressure state, this is preferable, as it has been noted that the speed of the formation of the fluoride layer in the first process increases. For example, the thickness of a fluoride film formed in the case in which, prior to the heating of an aluminum alloy containing magnesium to a temperature of 300° C. in an atmosphere of fluorine gas and the formation of a fluoride film thereon, the aluminum alloy was heated to a temperature of 400° C. (baking) in an inert gas atmosphere, was approximately 1.6 times the thickness of a film formed in the case in which baking was conducted at a temperature of 250° C. That is to say, with reference to the 3 cases in which: (1) baking was conducted for 2 hours at 400° C., (2) baking was conducted for 2 hours at 250° C., and (3) baking was not conducted, when fluoridation processing was conducted for 80 minutes at a temperature of 300° C., the thickness of the fluoride film which was formed was 18 nm in case (1), 11 nm in case (2), and 10 nm in case (3).

When the surface of the substrate body was subjected to cleaning prior to the first process in place of baking or in addition to baking, a further increase in the speed of fluoride film formation was noted, so that it is preferable that cleaning be conducted. Cleaning should be conducted, for example, within energy ranges such that no damage will be done to the substrate or to the film formed thereon, and this cleaning may be conducted by means of sputtering cleaning, ray irradiation cleaning, electron beam irradiation cleaning, and the like.

To explain using an MOS as an example, the metal films in regions 29, 30, and 31 in FIG. 1 are, for example, formed by the sputtering method, the CVD method, or the like using aluminum containing magnesium or Ni containing phosphorus. Furthermore, for example, after the formation of a metal film containing aluminum or magnesium comprising aluminum, AlSi, AlCu, AlCuSi, or the like, a film is formed by means of the sputtering method, the CVD method, or the nonelectrolytic plating method using, for example, Ni containing phosphorus, or the like.

The thickness of the metal fluoride film of the present invention is not particularly limited; it should be determined in accordance with the requirements for the electronic device. However, the insulating ability of the metal fluoride film of the present invention is superior, so that in the case in which insulating ability is the object, it is possible to form an extremely thin layer in comparison with the conventional insulating film, so that this represents an advantage.

EXPLANATION OF THE REFERENCES

Figure 1:
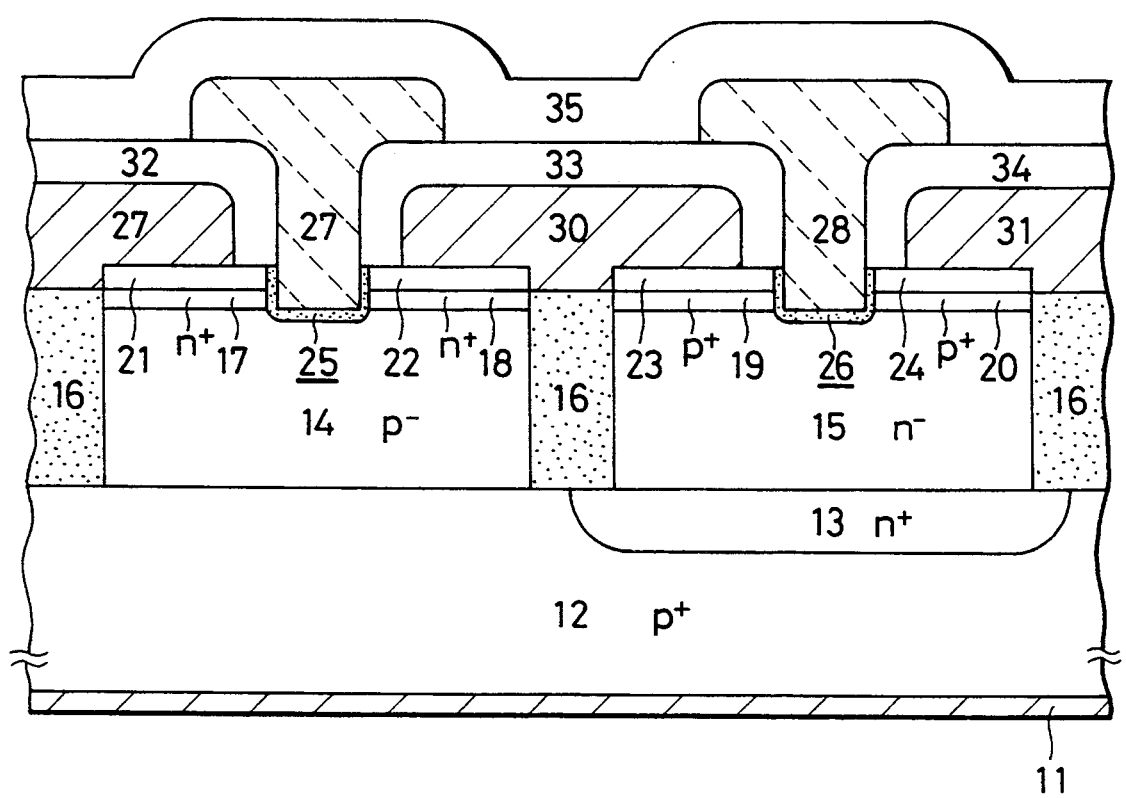
FIG. 1 is a cross sectional structural diagram of a semiconductor device which is an example of the present invention.

11 . . . electrode of the rear surface of the substrate
12 . . . p+ substrate
13 . . . n+ embedded region
14 . . . high resistance region
15 . . . high resistance ratio n− region
16 . . . insulating separating region
17, 18 . . . n+ region
19, 20 . . . p+ region
21, 22, 23, 24 . . . metal silicide
25, 26 . . . silicon oxide film (gate insulating film)
27, 28 . . . gate electrode
29, 30, 31 . . . metal electrode
32, 33, 34 . . . metal fluoride
35 . . . PSG film, nitride film.

DESCRIPTION OF THE PREFERRED EMBODIMENT

Next, a preferred embodiment of the present invention will be explained with reference to the diagrams using the example of a semiconductor device.

FIG. 1 is a cross sectional view of a semiconductor device illustrating this preferred embodiment.

Here, only one pair of CMOS included in the semiconductor device is depicted. In FIG. 1, reference numeral 11 indicates the substrate rear surface electrode, reference numeral 12 indicates a p+ substrate, reference numeral 13 indicates an n+ embedded region, reference numeral 14 indicates a high resistance p− region, reference numeral 15 indicates a high resistance ratio n− region, reference numeral 16 indicates an insulating separating region, reference numerals 17 and 18 indicate $n^{+0}$ regions, reference numerals 19 and 20 indicate p+ regions, reference numerals 21, 22, 23, and 24 indicate metal silicides such as $MoSi_2$, $WSi_2$, $TaSi_2$, $TiSi_2$, $Pd_2Si$, and the like, reference numerals 25 and 26 indicate silicon oxide films (gate insulating films), reference numerals 27 and 28 indicate gate electrodes, reference numerals 29, 30, and 31 indicate metal electrodes such as AlMg, NiP, and the like, reference numerals 32, 33, and 34 indicate metal fluoride films formed according to the above method for the purpose of insulating and separating electrodes 27, 28, 29, 30, and 31, and reference numeral 35 indicates a PSG film or nitride film for passivation.

In FIG. 1, the boundary between gate insulating film 25 and region 14 is formed more on the side of region 14 than is the boundary between regions 17 and 18 and region 14, and the boundary between gate insulating film 26 and region 15 is formed more on the side of region 15 than is the boundary between regions 19 and 20 and region 15. In this construction, as the electric field strength between the source and drain of the channel portion is reduced, the short channel effect is unlikely to occur.

In FIG. 1, it is preferable that the material of gate electrodes 27 and 28 have a high diffusion potential with respect to both the n+ regions 17 and 18 and the p+ regions 19 and 20. For example, if AlMg or NiP is selected as the material, a high diffusion potential can be obtained. If AlMg is selected, a diffusion potential on the order of 0.7 V will be obtained with respect to the n+ region, and a diffusion potential on the order of 0.4 V will be obtained with respect to the p+ region. Of course, the work function of the gate electrode should have a value which has a high barrier with respect to both the n+ region and the p+ region; a metal with a high melting point or a metal silicide is acceptable. Accordingly, the resistance of the gate electrode is small. Furthermore, in this construction, a potential barrier is created in the channel by means of the diffusion potential of the p+ substrate 12 and the gate electrode 27 with respect to the n+ source region, and by means of the diffusion potential of the n+ embedded region 13 and the gate electrode 28 with respect to the p+ source region, and when the impurity density of channel regions 14 and 15 is on the order of $10^{14}$–$10^{16}$ $cm^{-3}$, the normally-off characteristics in the MOS transistor are realized. That is to say, region 14 and region 15 are high resistance regions, and the impurity concentrations thereof are maintained at a low level. Accordingly, the width of the channel along which electrons and holes flow is maintained at a wide level, and a short channel is realized without a reduction in the movement of the carriers running along the channel. That is to say, a MOS transistor having a large transformational conductance $g_m$ is realized.

In FIG. 1, the junction surface of the n+ region 17 and region 14, the junction surface of the n+ region 18 and region 14, the junction surface of p+ region 19 and region 15, and the junction surface of the p+ region 20 and region 15 are flat surfaces, and the surface area of the junction surface is small, so that the fringe effect is small and the capacity is small between the source region and drain region, between the source region and the substrate, and between the drain region and the substrate.

In FIG. 1, the material of electrodes 29, 30, and 31 is, for example, AlMg or NiP, and the resistance of the source electrode and the drain electrode is small. The source resistance, drain resistance, and gate resistance are all small, and furthermore, the source capacity and the drain capacity is also small, and in addition, the transformational capacitance $g_m$ is large, so that the transistor has superior high speed characteristics. Of course, the source electrode and the drain electrode may comprise metals such as Mo, W, Ta, Ti, and the like.

In this way, by means of the semiconductor device having a construction which is provided with a metal fluoride film formed according to the present method, a semiconductor integrated circuit using a transistor which has superior very high speed characteristics can be realized.

In FIG. 1, explanation was made concerning the case in which a p+ substrate 12 which is provided with an n+ embedded region 13 was used as the substrate; however, the functions of the semiconductor device described above can also be realized using an insulating substrate such as sapphire, spinel, quartz, AlN, SiC, or the like.

Figure 2A:
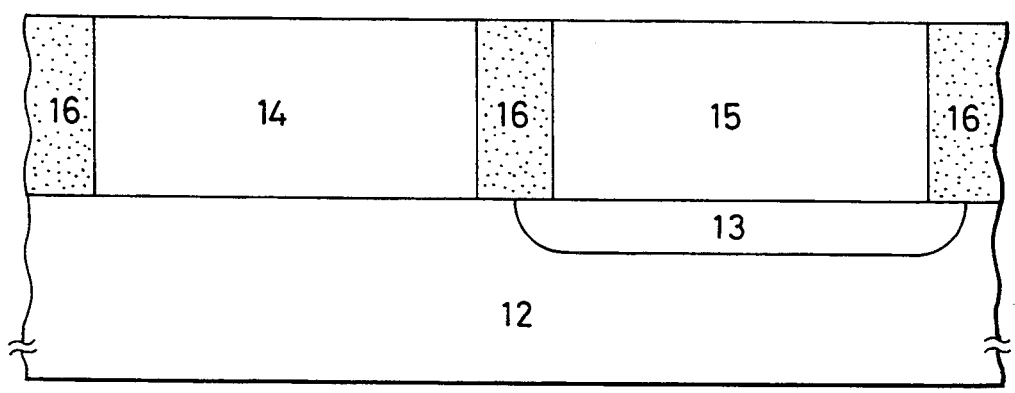
FIGS. 2(a)-2(e) are cross sectional view showing the manufacturing process of a semiconductor device in accordance with the present invention.
Figure 2B:
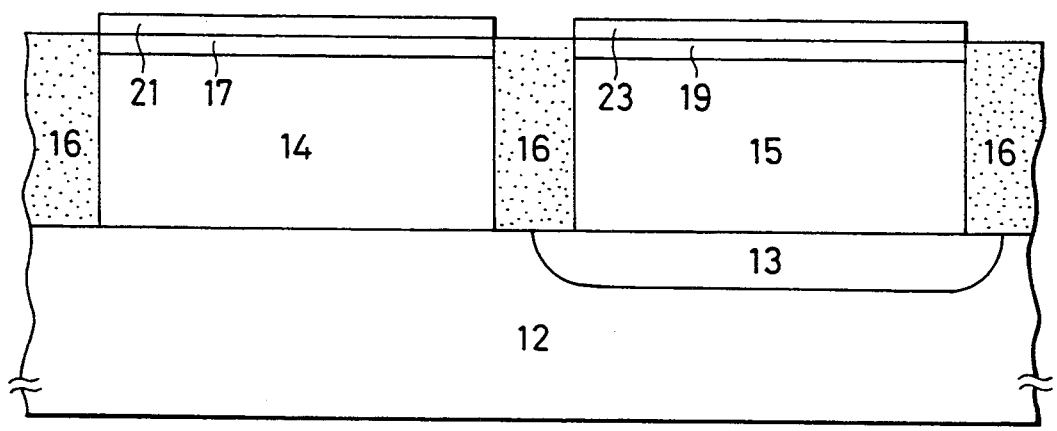
Figure 2C:
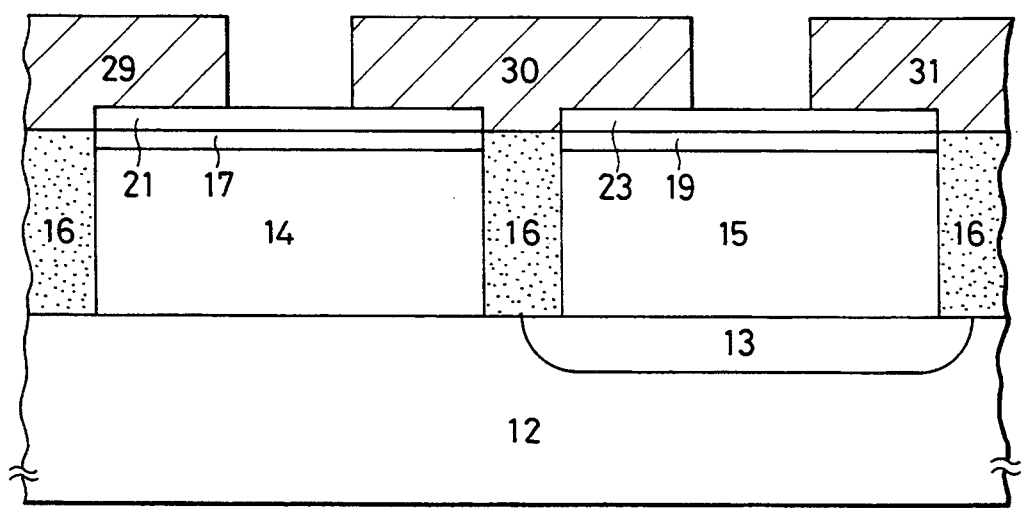

Next, an example of a manufacturing process for producing the semiconductor device of FIG. 1 is shown in FIGS. 2(a)–2(c). A case in which a p+ substrate was used as substrate 12 will be explained. In region 13 of p+ substrate 12, a n+ embedded region is formed by the thermal diffusion of P from a PSG film deposited by means of the CVD method. Of course, region 13 may also be formed by the ion implantation of P or As, or by activated annealing. Separation region 16, p− region 14 and n− region 15 are formed, for example, in the following manner. After the thermal oxidation of approximately 10 s of nm of the surface of the substrate 12 having an embedded region 13, a PSG film or a BPSG film is formed with a fixed thickness by means of the CVD method. The portions corresponding to regions 14 and 15 of the thermally oxidized film and the PSG film or BPSG film are removed by means of reactive ion etching. Next, by means of a CVD method using SiH$_4$, Si$_2$H$_6$, or SiH$_2$Cl$_2$, regions 14 and 15 are formed by means of selective epitaxial growth.

The structure shown in FIG. 2(a) is formed in this manner; however, the method is not necessarily so restricted, and other methods may be used for the formation thereof. The thicknesses of regions 14 and 15 should be appropriately selected based on the device which is being made; however, it is acceptable to select a value within a range of 0.03–0.5 micrometers.

Next, a metal layer, for example, a layer comprising W, Ta, Ti, Mo, or the like, having a thickness of 10–20 nm is selectively grown on the surface of regions 14 and 15. After this, by means of the implantation of ions which pass through these metal layers, by the selective use of, for example, As in region 14 and B in region 15, and by then conducting activated annealing, the silicide layers of regions 21, 22, 23, and 24, n+ regions 17 and 18 and p+ regions 19 and 20 are formed, as shown in FIG. 2(b). Next, for example, an AlMg film having a thickness of 0.2–1.0 micrometers is formed by the sputtering method or the CVD method, and specified regions are etched by means of reactive ion etching as shown in FIG. 2 (c).

Figure 2D:
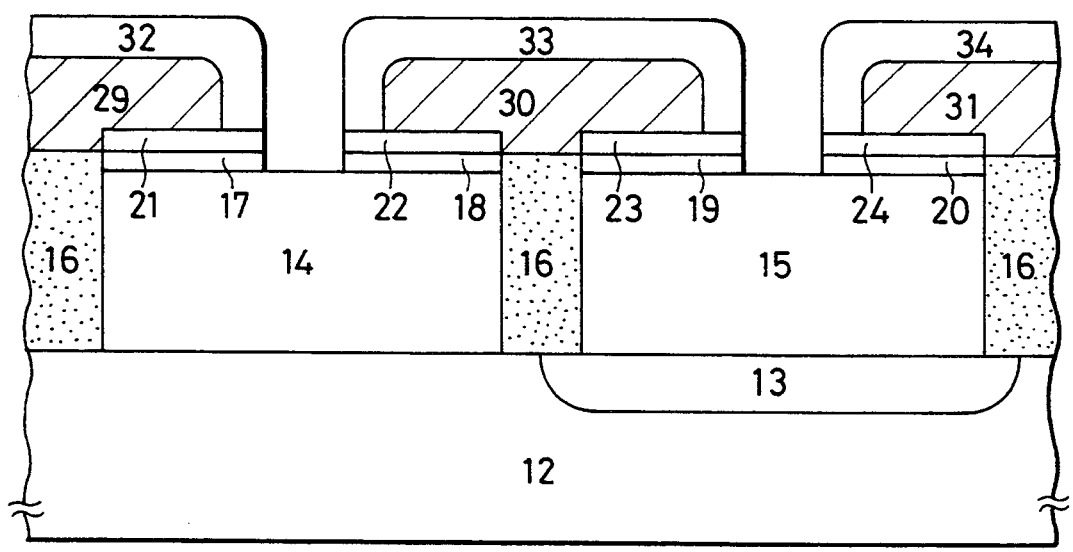

The surface of regions 29, 30, and 31 was fluoridated at a temperature of, for example, 100° C. and for a period of 4 hours using extremely pure F$_2$ gas, and then annealing was conducted in an atmosphere of an inert gas (for example, N$_2$ gas) at a temperature of 150° C. for a period of 5 hours, and on the AlMg region surface, an insulating layer of a mixture of aluminum fluoride and magnesium fluoride (regions 32, 33, and 34 in FIG. 2(d)) was formed. Next, as shown in FIG. 2(d), using regions 32, 33, and 34 as masks, specified regions of the metal silicide layer, n+ region, and p+ region were etched by means of reactive ion etching, and contact holes were formed.

Figure 2E:
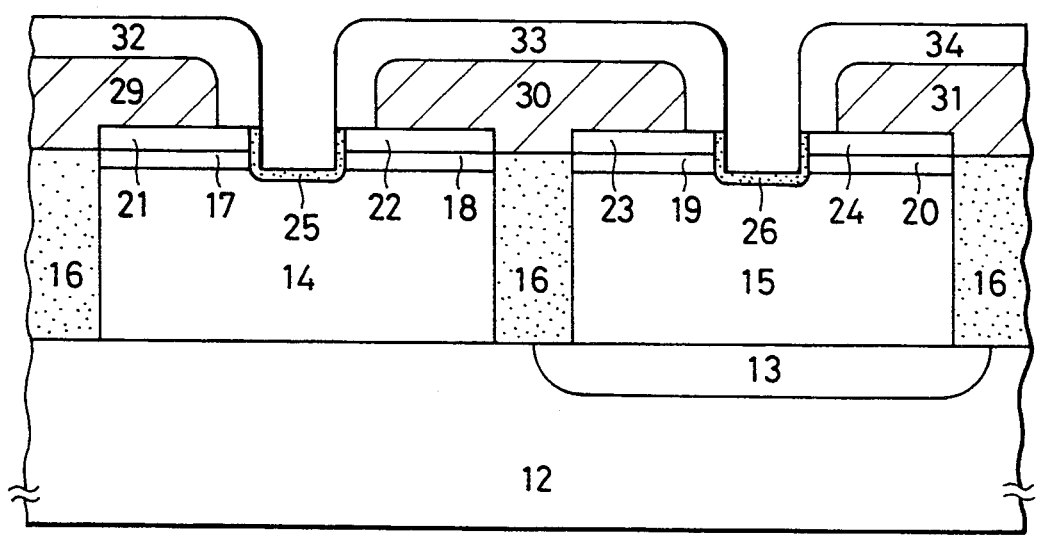

Next, if processing is conducted in accordance with the above method, an oxidized layer will form on the surface exposed by the contact hole. That is to say, as is shown in FIG. 2(e), an n+ region, a p+ region, an n− region, and an oxidized film formed by means of oxidation are formed on the silicide layer.

Furthermore, the structure of the semiconductor device shown in FIG. 1 can be created by means of the formation of gate electrodes 27 and 28, the etching of specified regions, the formation of a passivation layer 35, and the subsequent formation of electrode 11.

Field of Use in Industry

The metal fluoride film of the present invention has superior insulating characteristics so that it is possible, where necessary, to make it extremely thin, and accordingly, extremely fine electronic devices can be realized.

As production by means of self-alignment is possible, extremely fine processes are possible, and accordingly, electronic devices possessing a high degree of integration which are finely processed can be obtained.

In the case in which the electronic device is an MOS, the semiconductor device provided with this metal fluoride film has high transformational conductance, and has a short channel, so that the high speed characteristics thereof are superior.

I claim:

1. A semiconductor device comprising a metal fluoride film in at least part of an insulating film.

2. The semiconductor device of claim 1 wherein said insulating film is a MOS interlinear insulating film.

3. The semiconductor device of claim 1 wherein said insulating film is an insulating film which insulates and separates between a gate electrode and a source and/or a drain electrode.

4. The semiconductor device of claim 1 wherein said metal fluoride film is a fluoride film used as a mask for etching.

5. The semiconductor device of claim 1 wherein said metal fluoride film is a mixed film of magnesium fluoride and aluminum fluoride.

6. The semiconductor device of claim 5 wherein said metal fluoride film is a film formed by direct fluoridation of aluminum containing magnesium.

7. The semiconductor device of claim 6 wherein said aluminum containing magnesium contains an amount of magnesium within a range of 0.02–5 wt %.

8. An electronic device comprising a metal fluoride film in at least part of an insulating film, wherein said metal fluoride film comprises a fluoride of nickel containing phosphorus.

9. The electronic device of claim 8 wherein said metal fluoride film is a film which is formed by direct fluoridation of a nickel film containing phosphorus.

10. The electronic device of claim 9 wherein said nickel film containing phosphorus is formed by means of a nonelectrolytic plating method.

* * * * *